United States Patent
Abe

[19]

[11] Patent Number: 5,969,558

[45] Date of Patent: Oct. 19, 1999

[54] ABNORMAL CLOCK SIGNAL DETECTOR AND SWITCHING DEVICE

[75] Inventor: Shinichi Abe, Tokyo, Japan

[73] Assignee: Oki Electric Industry Co., Ltd., Tokyo, Japan

[21] Appl. No.: 08/891,639

[22] Filed: Jul. 11, 1997

[30] Foreign Application Priority Data

Oct. 17, 1996 [JP] Japan ..................................... 8-274841

[51] Int. Cl.⁶ .............................. H03K 5/22; H03L 7/00
[52] U.S. Cl. ............................. 327/292; 327/20; 331/49; 331/74
[58] Field of Search ..................................... 327/292, 526, 327/144, 20, 18, 99, 294, 145; 331/49, 46, 74; 326/10

[56] References Cited

U.S. PATENT DOCUMENTS

| | | | |
|---|---|---|---|
| 3,708,686 | 1/1973 | Butler, Jr. et al. ...................... | 307/149 |
| 4,254,492 | 3/1981 | McDermott, III ........................ | 331/49 |
| 4,949,052 | 8/1990 | Chigira ..................................... | 331/49 |
| 5,063,357 | 11/1991 | Williams et al. .......................... | 331/49 |
| 5,371,764 | 12/1994 | Gillingham et al. ...................... | 307/23 |
| 5,416,443 | 5/1995 | Cranford, Jr. et al. ..................... | 331/2 |

FOREIGN PATENT DOCUMENTS

| | | | |
|---|---|---|---|
| 58-170113 | 10/1983 | Japan .............................. | H03K 5/19 |
| 2-93854 | 7/1990 | Japan ............................... | H04L 7/00 |
| 7-248843 | 9/1995 | Japan ................................. | G06F 1/04 |

*Primary Examiner*—Timothy P. Callahan
*Assistant Examiner*—Terry L. Englund
*Attorney, Agent, or Firm*—Rabin & Champagne, P.C.

[57] ABSTRACT

A system clock signal switching device capable of switching outputs from a plurality of clock signal generation systems i order to ensure the continuous supply of a stable system clock signal. An oscillation circuit A generates a clock signal CK1 as an ordinary system clock signal while an oscillation circuit B generates a clock signal CK2 as another separate clock signal, such as the time-count clock signal. The output lines of these circuits are connected with the input terminals of a multiplexer. An output clock signal monitor circuit checks the clock signal CK1 from the oscillation circuit A, wherein input terminals of the monitor are connected with the output lines to attain the operational clock signals for its monitoring operation. A monitor flag from the monitor circuit is supplied to a switching signal input terminal of the multiplexer via a line. An output line of the multiplexer is provided to a subsequent circuit using the system clock signal while the output line of the oscillation circuit B is provided to the subsequent circuits such as a time-count circuit.

14 Claims, 4 Drawing Sheets

PRIOR ART

ABNORMAL CLOCK SIGNAL DETECTOR AND SWITCHING DEVICE

BACKGROUND OF THE INVENTION

The invention generally relates to a system clock signal switching device which controls a plurality of clock signal generation systems to switch clock signals from one clock signal generation system to those from the other clock signal generation system. More particularly, the invention relates to a system clock signal switching device which is effectively operable, for instance, in a micro-controller having a plurality of clock signal generation systems, in such a manner that they monitor each other and that whenever one of them falls in an abnormal state, the normal clock is substituted for the abnormal one, thus enabling the device to be provided with a fail-safe function.

FIG. 4 is a diagram showing an example of a prior art oscillation circuit arrangement which has been often employed in micro-controller designs.

As shown in the figure, there are provided in the micro-controller an oscillation circuit A which generates an ordinary system clock signal CK1 and another oscillation circuit B which generates a time-count clock signal CK2 having a frequency lower than that of the clock signal CK1, and these respectively exist as an independent clock signal generation system in the micro-controller.

In such micro-controllers, it is possible to set the system in a power-down mode by supplying a power-down signal PD commanding the power-down to one of clock signal generation systems. To be more concrete, the power-down mode can be set by transmitting the power-down signal PD to the oscillation circuit A to suspend the oscillating operation thereof, and at the same time, by switching the system clock signal for the micro-controller, in the multiplexer C, from the clock signal CK1 of the oscillation circuit A to the time-count clock signal CK2 from the low frequency oscillation circuit B. With the setting of this power-down mode, the power consumption can be considerably reduced while the entire system is in the standby mode. If, however, any failure occurs in an oscillation element and/or an electrical contact of the oscillation circuit A due to some external influential factors such as external noises, there would be an abrupt, unexpected interruption of the oscillation of the clock signal CK1, which is used as the rightful system clock signal. If such accident has occurred beyond the operator's will, the entire system might be interrupted even if the micro-controller redundantly includes two oscillation circuits A and B, because it would not be possible to make use of the clock signal CK2 from the other oscillation circuit B unless the power-down command signal PD is supplied to the multiplexer C, this is a problem to be obviated from the prior art device.

SUMMARY OF THE INVENTION

Accordingly, an object of the invention is to provide a novel and improved system clock signal switching device having an enhanced fail-safe function, which is able to prevent the entire system operation from being interrupted, by making use of the clock signal from the other separate clock signal generation system as the system clock signal, should such accidental interruption take place in the oscillation circuit for generating the system clock signal.

Another object of the invention is to provide a novel and improved system clock signal switching device which has a plurality of clock signal generation systems monitoring each other to detect early whether the clock signal generation system is generating an abnormal clock signal, and which switches the clock output to the normal clock signal generation system output, thereby preventing the entire system operation from being interrupted.

To achieve these objects, according to the invention, there is provided a system clock signal switching device which comprises a plurality of clock signal generation systems for generating a plurality of clock signals including the system clock signal; a monitor device which uses the clock signal from one clock signal generation system as the operational clock signal for monitoring the clock signal of the other clock signal generation system; and a clock signal switch which, upon detection of an abnormality in the clock signal from the clock signal generation system under surveillance by the monitor device, switches from the abnormal clock signal to the clock signal from a substitute clock signal generation system. Furthermore, the device may include a frequency adjustment device which adjusts the frequency of the substitute clock signal to the frequency of the clock signal from the clock signal generation system that is under surveillance by the monitor device.

The features of the invention will become clear from the following detailed description and accompanying drawings.

PREFERRED EMBODIMENTS OF THE INVENTION

Now, in the following, a few exemplary system clock signal switching devices embodying the invention will be described with reference to the accompanying drawings.

(First Embodiment)

Figure 1:
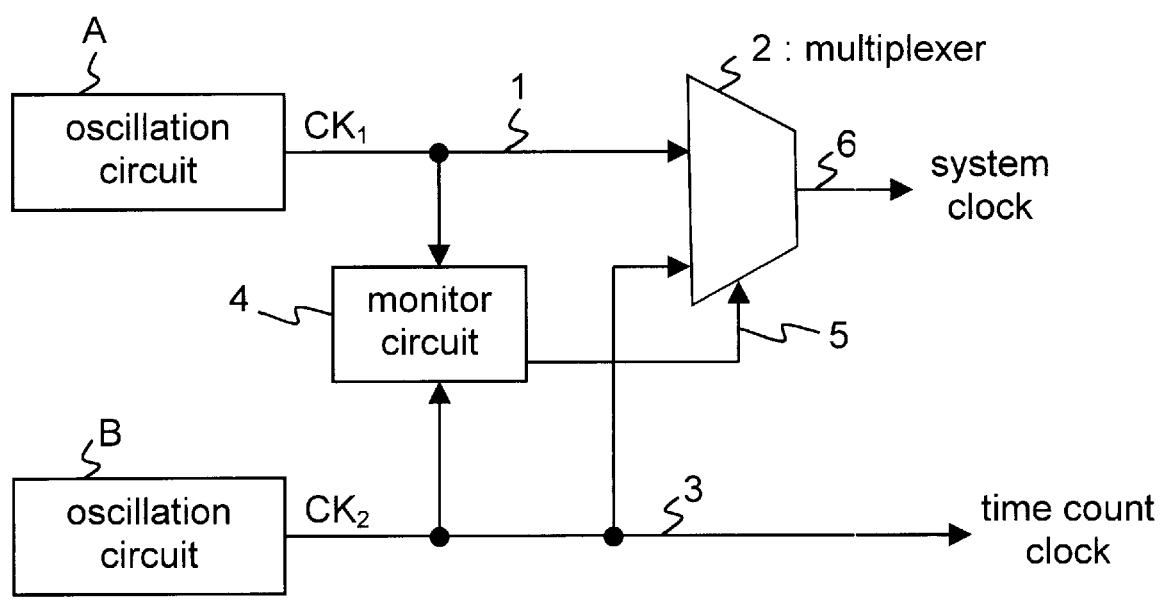
FIG. 1 is a block diagram of a system clock signal switching device according to the first embodiment of the invention.

Referring to FIG. 1, an oscillation circuit A is the circuit that generates clock signal CK1 as the system clock signal, at a frequency of approximately 10 MHz for instance, and the output line 1 of the oscillation circuit A is connected with one input terminal of a multiplexer 2.

Another oscillation circuit B is the circuit that generates clock signal CK2 for a time count, at a frequency of approximately 32 KHz for instance, and the output line 3 of the oscillation circuit B is connected with another input terminal of the multiplexer 2.

A reference numeral 4 represents an output clock signal monitor circuit for checking the clock signal CK1 from the oscillation circuit A. The monitor circuit 4 connects its input terminal with the output line 3 of the oscillation circuit B and observes the clock signal CK1 of the output line 1 by using the time-count clock signal CK2 as an operational clock signal for monitoring. Namely, the monitor circuit 4 determines if the clock signal CK1, which is the system clock signal, has a normal frequency or not, using the time-count clock signal CK2 as a reference clock signal.

A monitor flag from the monitor circuit 4 is supplied to the switching signal input terminal of the multiplexer 2 via the line 5. The output signal line 6 of the multiplexer 2 is connected with a circuit or circuits of the micro-controller which uses the system clock signal while the output line 3 of the oscillation circuit B is connected with a time-count circuit and others.

The operation of the system clock signal switching device as constituted above will be explained in the following.

During normal operation, the clock signal CK1 generated by the oscillation circuit A is provided through the line 1 to the multiplexer 2 which, in turn, usually selects the clock signal CK1 and provides the selected signal on its output signal line 6. However, when something abnormal happens in the oscillation circuit A and no normal clock signal is provided on the output line 1, the monitor circuit 4 detects such situation and inverts the monitor flag of the line 5. It is to be noted that the abnormal state of the oscillation circuit as here detected includes not only the interruption of the clock signal generation but also any condition of oscillation resulting in generation of an unstable clock signal.

Having received the above inverted monitor flag, the multiplexer 2 switches the output signal line 6 to be connected with the line 3 instead of the line 1, and provides the clock signal CK2 from the oscillation circuit B, as the system clock signal on its output signal line 6.

Therefore, in the system clock signal switching device which is constituted and operated as mentioned above, even if the oscillation circuit A which has to rightfully generate the system clock signal, unexpectedly interrupts its oscillating operation because of some abnormal occurrence, as it is possible to make use of the clock signals from another existing clock signal generation system such as the time-count clock signal generation system, there is no chance for supply of the system clock signal to be interrupted. Furthermore, as mentioned above, the time-count clock signals can be utilized not only as the operational clock signal for a monitoring means but also as the substitute clock signals from another separate clock signal generation system. Still furthermore, the changeover to another separate clock signal generation system can be simply carried out by merely inverting the monitor flag from the monitor circuit 4, so that the system clock signal can be continuously supplied to the micro-controller, such as in the case of switching the operation mode to the power-down mode, so that interruption of the entire system is absolutely avoided. Thus, reliability of the system clock signal switching device can be enhanced to a great extent.

(Second Embodiment)

Figure 2:
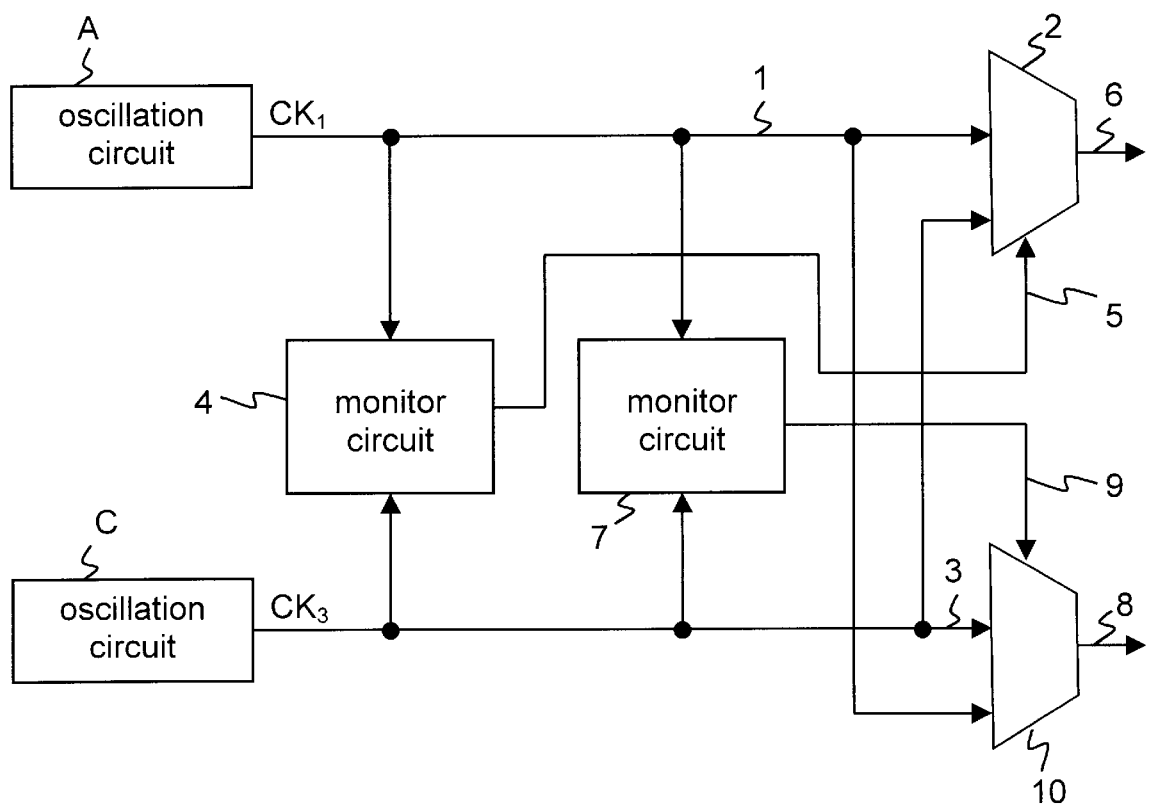
FIG. 2 is a block diagram of a system clock signal switching device according to the second embodiment of the invention.

Referring to FIG. 2, an oscillation circuit A is the circuit that generates clock signal CK1 as the system clock, at a frequency of approximately 10 MHz for instance, and the output line 1 of the oscillation circuit A is connected with one input terminal of a multiplexer 2.

Another oscillation circuit C is the circuit that generates clock signal CK3 as the clock signal from a separate clock signal generation system, at a frequency of approximately 1 KHz for instance, and the output line 3 of the oscillation circuit C is connected with another input terminal of the multiplexer 2.

A reference numeral 4 represents an output clock signal monitor circuit for observing the clock signal CK1 from the oscillation circuit A. The monitor circuit 4 connects its input terminal with the output line 3 of the oscillation circuit C and checks the clock signal CK1 of the output line 1. In addition, another output clock signal monitor circuit 7 is provided in order to monitor the clock signal CK3 from the oscillation circuit C. In order to operate the monitor circuit 7, its clock signal input terminal is connected with the output line 1, from which the clock signal CK1 is supplied to the monitor circuit 7.

A monitor flag from the monitor circuit 4 is supplied to the switching signal input terminal of the multiplexer 2 via the line 5. Also, a monitor flag from the monitor circuit 7 is supplied to the switching signal input terminal of the multiplexer 10 via the line 9. The output signal lines 6 and 8 of these multiplexers 2 and 10 are respectively connected with a circuit or circuits which need supply of the system clock signal, and with a time-count circuit etc. in the micro-controller.

The operation of the system clock signal switching device as constituted above will be explained in the following.

As described above, in addition to the above-mentioned first embodiment of the invention, the device according to the second embodiment of the invention is further provided with the multiplexer 10 and the monitor circuit 7 which checks the clock signal CK3 from the oscillation circuit C. That is, contrary to the case of the monitor circuit 4, the monitor circuit 7 checks if the clock signal CK3 from the oscillation circuit C is normal or not, using the clock signal CK1 of the line 1 from the oscillation circuit A as the reference clock signal. Under normal conditions, the clock signal CK3 of the output line 3 is usually selected by the multiplexer 10 and provided to the output signal line 8 thereof. However, when something abnormal happens in the oscillation circuit C and no normal clock is provided on the output line 8, the monitor circuit 7 detects such a situation and inverts the monitor flag and sends it to the multiplexer 10 on a line 9.

Having received the above inverted monitor flag, the multiplexer 10 switches the output signal line 8 to be connected with the line 1 instead of the line 3, and provides the clock signal CK1 from the oscillation circuit A in place of the clock signal CK3, as the system clock signal on the output signal line 8.

Therefore, according to the system clock signal switching device which is constituted and operated as mentioned above, in a micro-controller which includes two different clock signal generation systems such as oscillation circuits A and C generating different clocks CK1 and CK3 respectively, these clock signal generation systems may be provided with monitor circuits such as the monitor circuits 4 and 7, which uses the clock signal e.g. CK1 or CK3 from one clock signal generation system e.g. oscillation circuit A or C, as the operational clock signal for checking the clock signals e.g. CK3 or CK1 the from other clock signal generation system e.g. oscillation circuit C or A. Even if, therefore, something abnormal happens in one clock signal generation system, the system clock signal can be continuously supplied with the help of the other clock signal generation system. Especially, when the frequencies of two clock signals are close to each other, for instance the system clock signal and the time-count clock signal have frequencies which can be substituted for each other, the system clock signal and the time-count clock signal may be continuously supplied to the micro-controller by switching between them when necessary. Accordingly, the system clock signal switching device is more reliable than the device according to the first embodiment of the invention.

(Third Embodiment)

Figure 3:
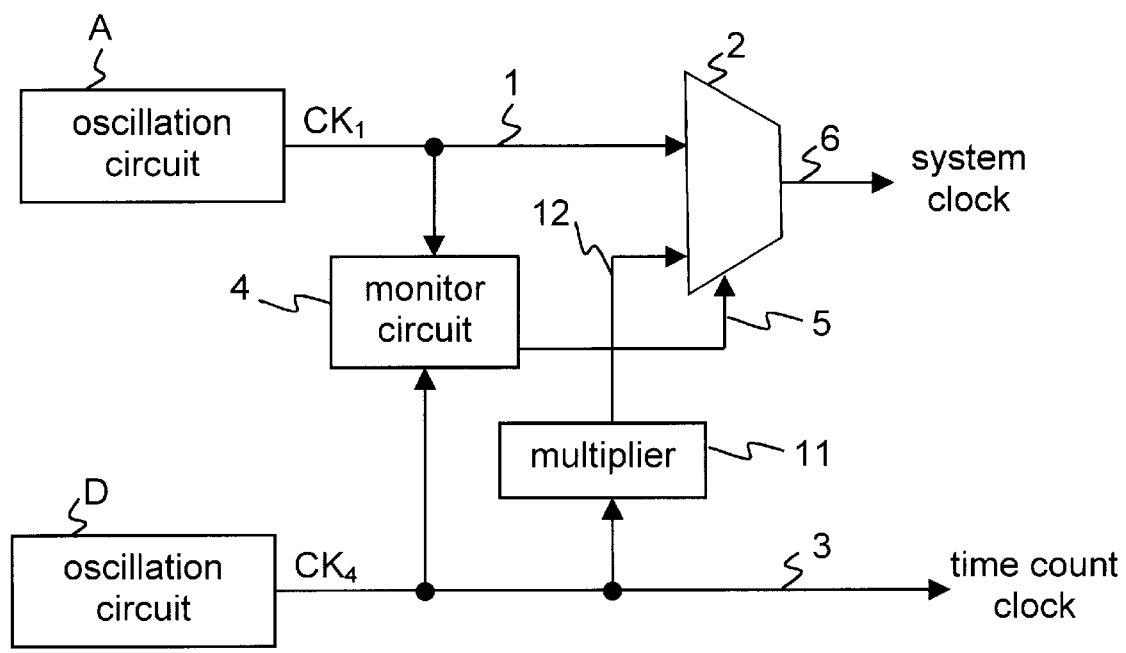
FIG. 3 is a block diagram of a system clock signal switching device according to the third embodiment of the invention.
Figure 4:
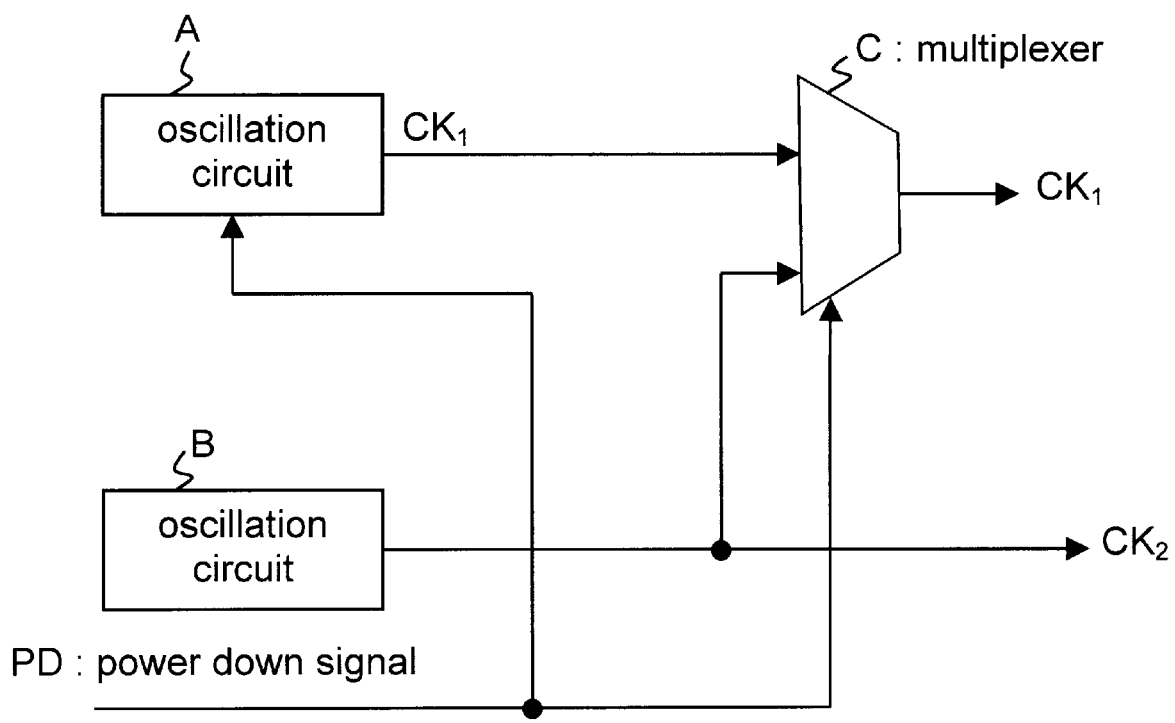
FIG. 4 is a diagram showing an example of a conventional system clock signal switching device.

Referring to FIG. 3, an oscillation circuit A is the circuit that generates clock signal CK1 as the system clock signal, at a frequency of approximately 10 MHz for instance, and the output line 1 of the oscillation circuit A is connected with one input terminal of a multiplexer 2.

Another oscillation circuit D is the circuit that generates a time-count clock signal CK4 for time count, at a frequency of approximately 5 MHz for instance, and the output line 3 of the oscillation circuit D is connected with another input terminal of the multiplexer 2 through a multiplier circuit 11.

The point that is different from the first embodiment (FIG. 1) is that the multiplier circuit 11, which doubles the frequency of the clock signal CK4, is disposed between the output line 3 and the multiplexer 2, thereby providing from the line 12, clock signals having a frequency almost equal to the frequency of the clock signal CK1 on the output line 1. Other parts of the device are arranged in the same manner as shown in FIG. 1.

The operation of the system clock signal switching device as constituted above will be explained in the following.

The system clock signal switching device operates basically in the same way as the device according to the above first embodiment, except that the frequency of the clock signal supplied to the multiplexer 2 through the line 12 is approximated to the clock signal CK1 from the oscillation circuit A by using the multiplier circuit 11. Consequently, if the system clock is switched from the clock signal CK1 generated by the oscillation circuit A to the clock signal CK4 from the oscillation circuit D, since the frequency of the clock signal CK4 is doubled by the multiplier circuit 11, the system clock signal supplied from the output signal line 6 to the micro-controller may show the identical function before and after changeover of the clock signals.

Thus, according to the system clock signal switching device which is constituted and operated as mentioned above, even if there is some difference between the frequency of the clock signal CK1 from the oscillation circuit A and that of the clock signal CK4 from the oscillation circuit D, since it is possible to always supply the system clock signal having the frequency approximated by making doubling the clock signal CK4 from the oscillation circuit D, the micro-controller could be continuously supplied with the system clock signal having the stable frequency, should something abnormal happen in the oscillation circuit A.

As described above, in the third embodiment, the frequency of the clock signal CK4 is multiplied by the multiplier circuit 11. Contrary to this, in case of using the clock signal CK1 from the oscillation circuit A as a clock signal for time count, if the frequency of the clock signal CK1 is reduced by using a frequency demultiplier circuit, the same effect as mentioned above may be obtained with regard to the time-count clock signals.

Furthermore, if applying the way of thinking adopted in the third embodiment to the device according to the above second embodiment in which two clock signal generation systems are made to monitor each other, there may be constituted another system clock signal switching device of the type wherein one clock signal generation system may multiply or demultiply its own clock signal frequency to approximate it to the clock signal frequency of the other clock signal generation system, and then provide the clock signal with the frequency as multiplied or demultiplied.

Still furthermore, in each of the above embodiments, the multiplexer is described such that it could receive only two kinds of inputs. However, the number of the clock signal inputs of the multiplexer may be increased in correspondence with the number of the clock signal generation systems, even though it is increased to more than two.

Since the system clock signal switching device of the invention is constituted as described above, the fail-safe of the device is surely established by using a separate clock signal generation system. Especially, when there exist a plurality of clock signal generation systems, it becomes possible to have them monitored against each other and to substitute them for each other when one of them experiences trouble.

A few preferred examples of the system clock signal switching devices embodying the invention have been described hereinabove with reference to the accompanying drawings, but it should be noted that the invention is not limited to these disclosed embodiments. It should be apparent to those skilled in the art that various changes or modifications may be made without departing from the technical thought as recited in the scope of claims for patent. Therefore, those changes and modifications should naturally fall with in the scope of the technical thought of the invention.

The entire disclosure of Japanese Patent Application No. 8-274841 filed on Oct. 17, 1996 including specification, claims, drawings, and summary is incorporated herein by reference in its entirely.

What is claimed is:

1. A system clock signal switching device, comprising:
a plurality of clock signal generators for generating a respective plurality of clock signals, including a first clock signal generator for generating an observed clock signal and a second clock signal generator for generating a substitute clock signal;
a monitor device to receive the observed clock signal and the substitute clock signal, for monitoring the observed clock signal to detect an abnormality in the observed clock signal;
a multiplier that adjusts the frequency of the substitute clock signal to provide an adjusted substitute clock signal having a frequency that is substantially the same as a frequency of the observed clock signal; and
a clock signal switch that provides an output clock signal, wherein the output clock signal corresponds to the observed clock signal if the abnormality is not detected by the monitor device and wherein the output clock signal corresponds to the adjusted substitute clock signal if the abnormality is detected by the monitor device.

2. A system clock signal switching device as claimed in claim 1, wherein the substitute clock signal is an operational clock signal.

3. A system clock signal switching device as claimed in claim 1, further comprising at least one additional monitor device, wherein each of the monitor devices receives two respective clock signals from the plurality of clock signals.

4. A system clock signal switching device as claimed in claim 1, wherein said clock signal switch includes a multiplexer circuit having a number of switching paths in correspondence with a number of the plurality of clock signal generators.

5. A system clock signal switching device as claimed in claim 1, wherein the observed clock signal is a system clock signal.

6. A clock signal switching device, comprising:
a first clock signal generator for generating a first clock signal;
a second clock signal generator for generating a second clock signal;
a monitor device that uses the second clock signal to monitor the first clock signal to detect an abnormality in the first clock signal;
a clock signal switch that, upon detection of the abnormality in the first clock signal by the monitor device, provides an adjusted second clock signal as an output, and otherwise provides the first clock signal as the output; and
a frequency adjuster that receives the second clock signal, adjusts a frequency of the second clock signal to correspond to a frequency of the first clock signal, and provides the adjusted second clock signal only to the clock signal switch.

7. A clock signal switching device as claimed in claim 6; wherein the frequency adjuster is a multiplier.

8. A clock signal switching device as claimed in claim 6, wherein the frequency adjuster is a demultiplier.

9. A clock signal switching device, comprising:

a first clock signal generator for generating a first clock signal;

a second clock signal generator for generating a second clock signal;

a monitor for receiving the first clock signal and the second clock signal, for monitoring the first clock signal to detect an abnormality based on the second clock signal, and for providing a monitoring result indicating whether the abnormality is detected;

a frequency adjuster that receives the second clock signal and adjusts a frequency of the second clock signal to provide an adjusted second clock signal; and a clock signal switch that receives the first clock signal and the adjusted second clock signal and provides one of the first clock signal and the adjusted second clock signal as an output, based on the monitoring result;

wherein the frequency adjuster provides the adjusted second clock signal only to the clock signal switch.

10. The clock signal switching device of claim 9, wherein the frequency adjuster is a multiplier.

11. The clock signal switching device of claim 9, wherein the frequency adjuster is a demultiplier.

12. The clock signal switching device of claim 9, wherein the monitor detects the abnormality based on a comparison of the first clock signal and the second clock signal.

13. The clock signal switching device of claim 9, wherein the clock signal switch provides the first clock signal as the output if the monitoring result indicates that the abnormality is not detected.

14. The clock signal switching device of claim 9, wherein the clock signal switch provides the adjusted second clock signal as the output if the monitoring result indicates that the abnormality is detected.

* * * * *